(12) United States Patent
Jiang et al.

(10) Patent No.: US 8,659,210 B2
(45) Date of Patent: Feb. 25, 2014

(54) PIEZO BASED INERTIA ACTUATOR FOR HIGH DEFINITION HAPTIC FEEDBACK

(75) Inventors: Li Jiang, Union City, CA (US); Daniel Gregory Parker, San Francisco, CA (US); Neil Olien, Montreal (CA)

(73) Assignee: Immersion Corporation, San Jose, CA (US)

( * ) Notice: Subject to any disclaimer, the term of this patent is extended or adjusted under 35 U.S.C. 154(b) by 69 days.

(21) Appl. No.: 13/286,467

(22) Filed: Nov. 1, 2011

(65) Prior Publication Data

US 2012/0104901 A1   May 3, 2012

Related U.S. Application Data

(60) Provisional application No. 61/409,467, filed on Nov. 2, 2010, provisional application No. 61/415,609, filed on Nov. 19, 2010.

(51) Int. Cl.
*H01L 41/08* (2006.01)

(52) U.S. Cl.
USPC ............................ 310/330; 310/329; 310/339

(58) Field of Classification Search
USPC ......................................... 310/329, 339, 328
See application file for complete search history.

(56) References Cited

U.S. PATENT DOCUMENTS

| | | | |
|---|---|---|---|
| 3,813,744 A * | 6/1974 | Morris | 29/25.35 |
| 4,315,433 A * | 2/1982 | Edelman et al. | 73/514.34 |
| 5,245,245 A | 9/1993 | Goldenberg | |
| 7,324,094 B2 | 1/2008 | Moilanen et al. | |
| 8,358,049 B2 * | 1/2013 | Morris et al. | 310/329 |
| 2006/0044699 A1 | 3/2006 | Hirano et al. | |
| 2008/0079331 A1 | 4/2008 | Butler et al. | |
| 2008/0079333 A1 | 4/2008 | Ulm et al. | |
| 2008/0136292 A1 | 6/2008 | Thiesen | |
| 2009/0235746 A1 | 9/2009 | Mutharasan et al. | |
| 2009/0313542 A1 | 12/2009 | Cruz-Hernandez et al. | |
| 2011/0074247 A1 * | 3/2011 | Hohlfeld et al. | 310/329 |
| 2011/0187514 A1 * | 8/2011 | Dong et al. | 340/407.1 |

OTHER PUBLICATIONS

International Search Report and Written Opinion as issued for PCT/US11/58954, dated Mar. 6, 2012.
International Preliminary Report on Patentability as issued for International Patent Application No. PCT/US2011/058954, dated May 7, 2013.

* cited by examiner

*Primary Examiner* — Mark Budd
(74) *Attorney, Agent, or Firm* — Pillsbury Winthrop Shaw Pittman LLP

(57) ABSTRACT

A haptic device includes an elongated piezo bender supported by a first holder and a second holder. The first holder and the second holder being spaced apart from each other and located at or near opposite ends of the elongated piezo bender. A mass is supported by the elongated piezo bender and positioned in between the first holder and the second holder. The mass has a non-uniform thickness in a direction along a major axis of the elongated piezo bender. An electrical driving signal generator is configured to generate a signal to create a vibration in the elongated piezo bender.

19 Claims, 13 Drawing Sheets

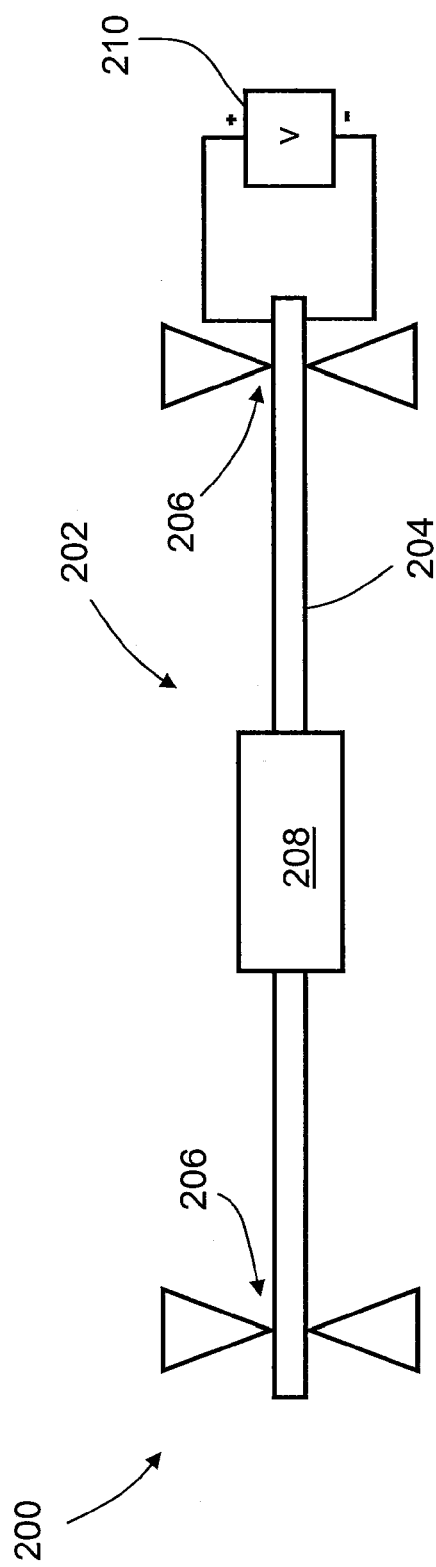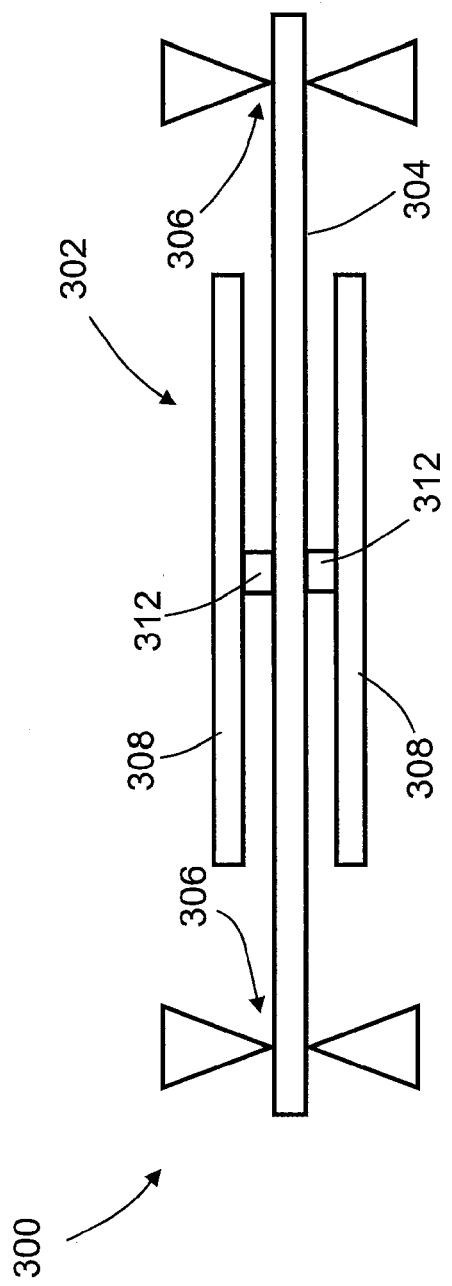
FIG. 2
FIG. 3

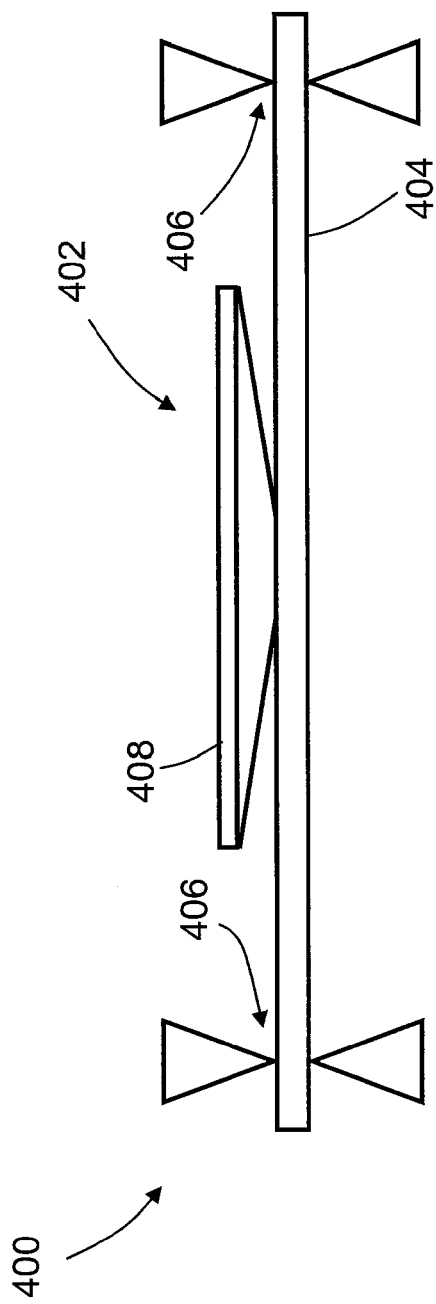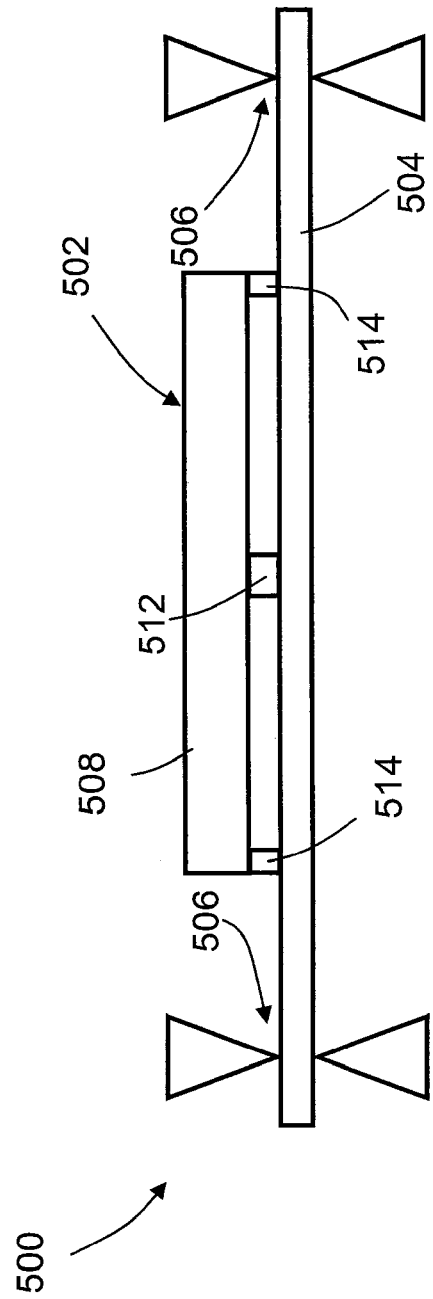

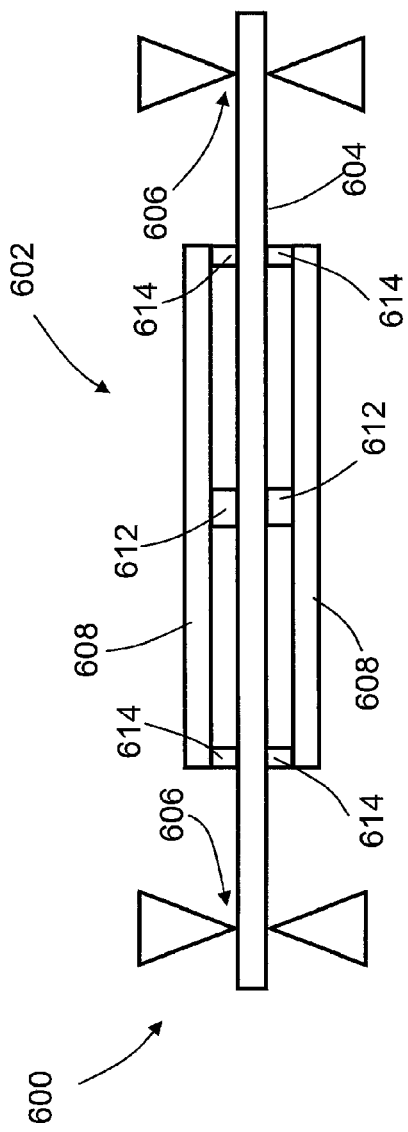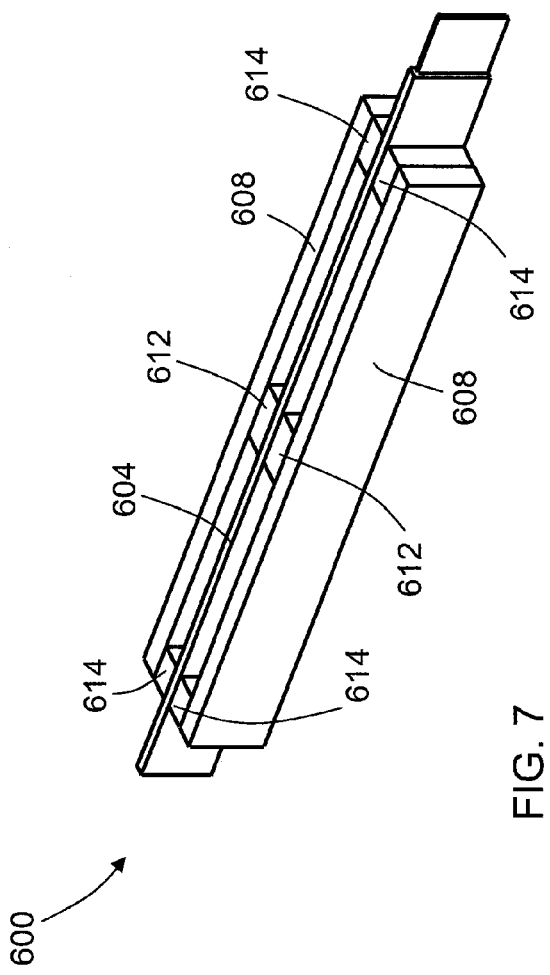
FIG. 6
FIG. 7

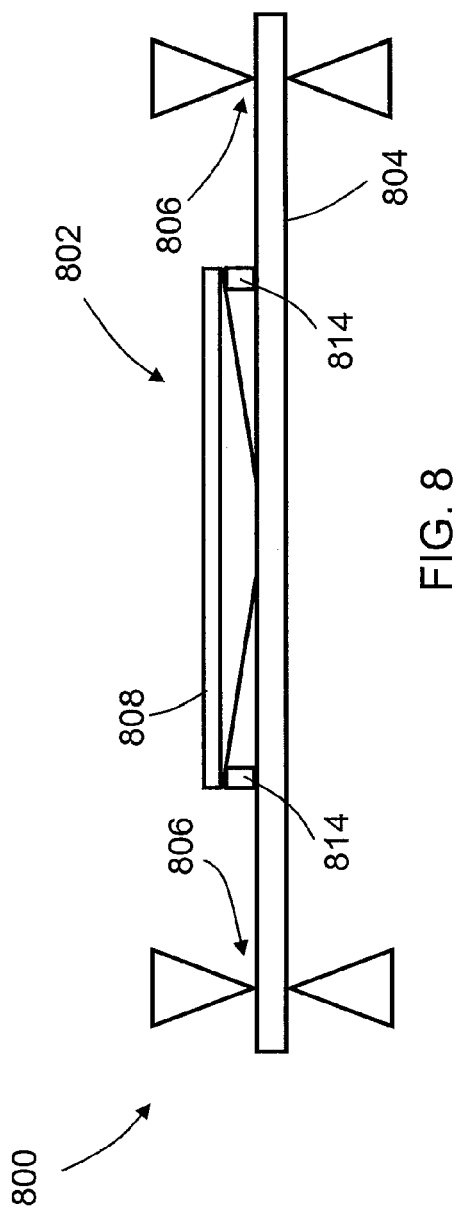
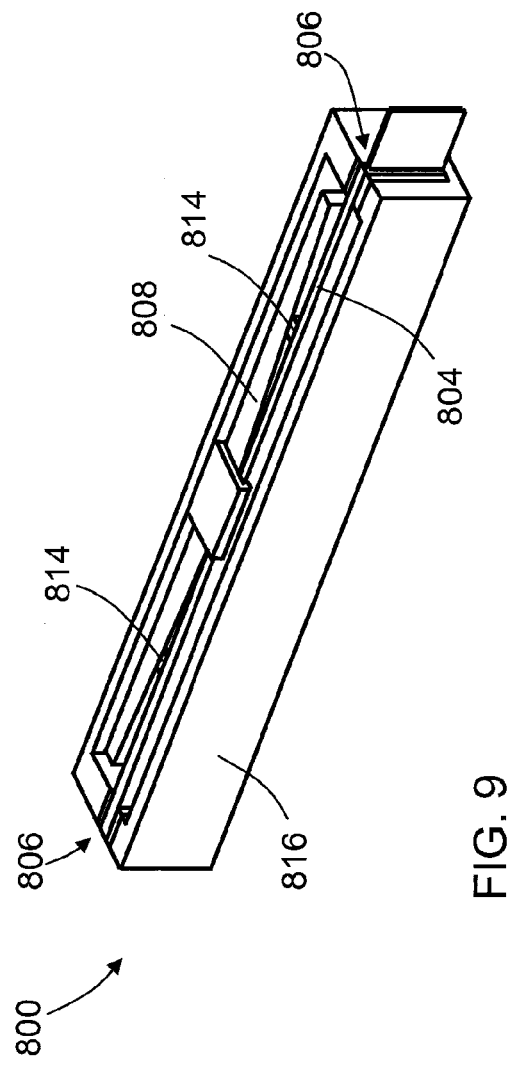

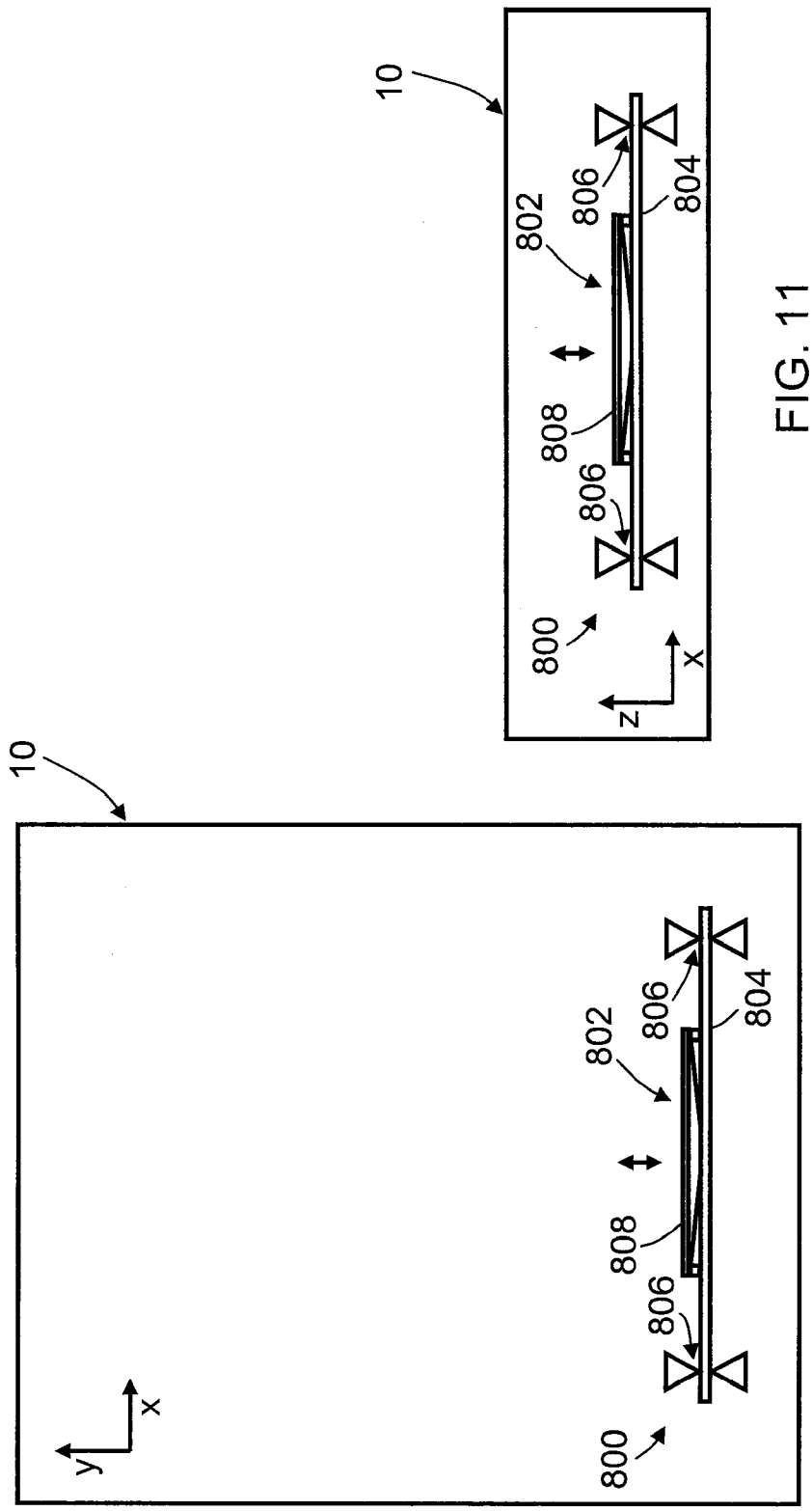

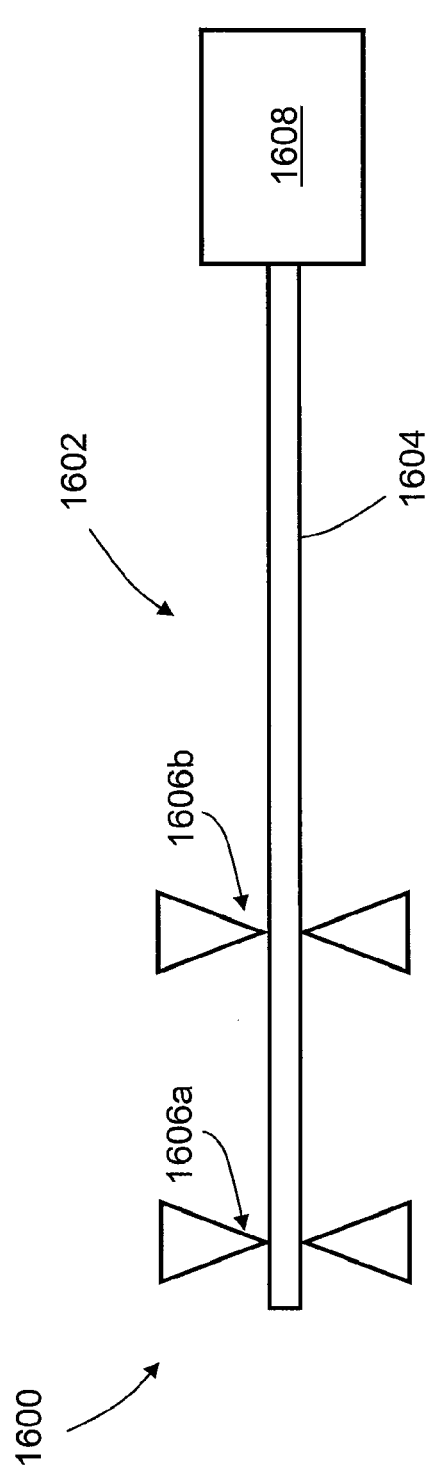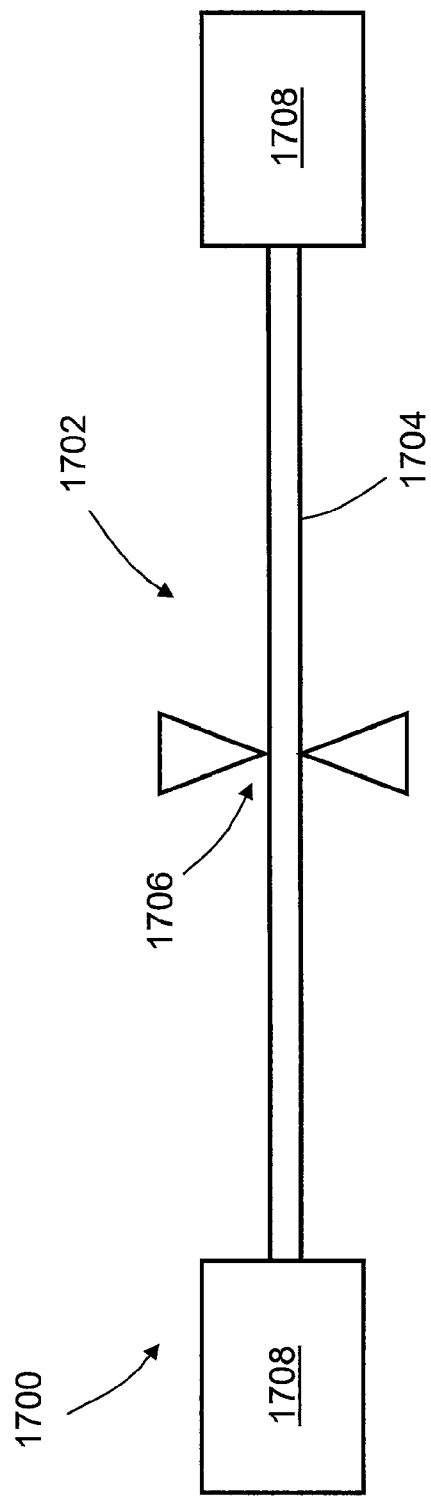

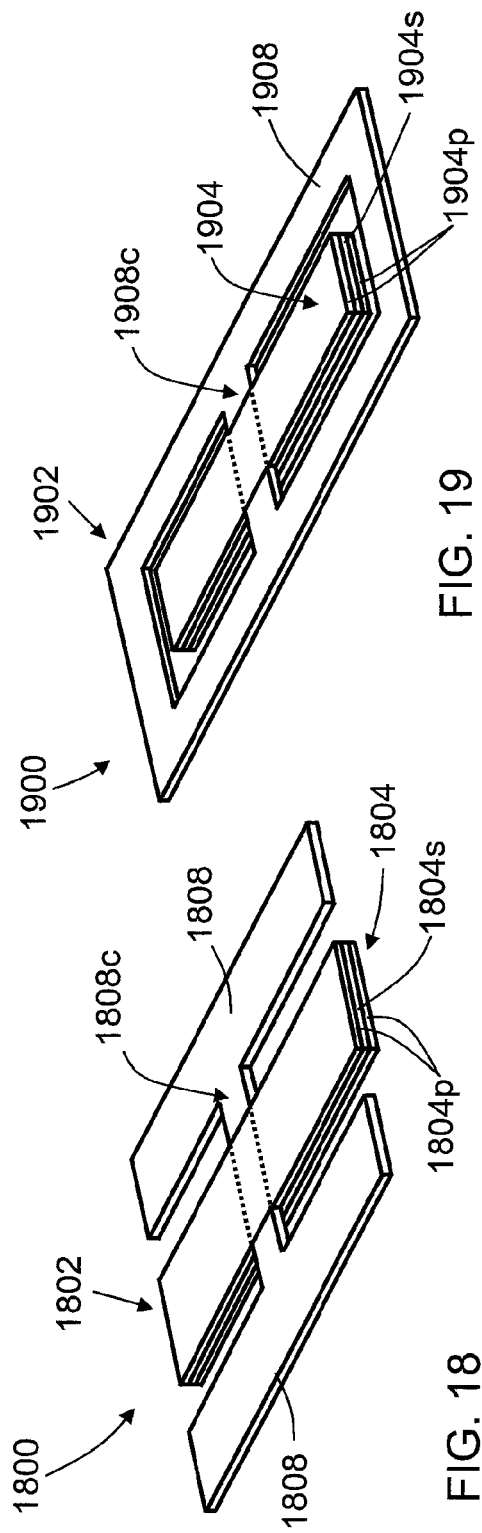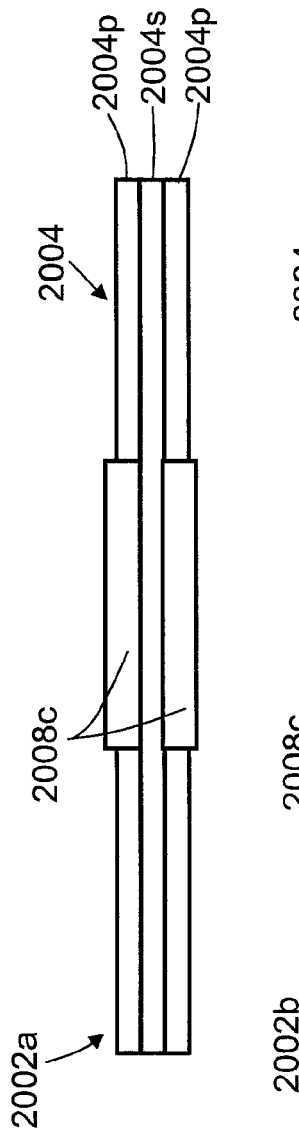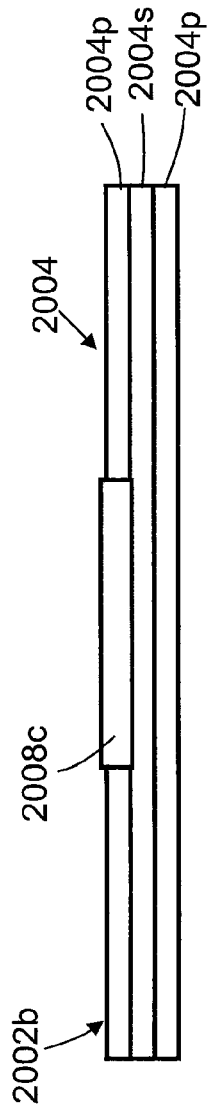
FIG. 19
FIG. 18
FIG. 20A
FIG. 20B

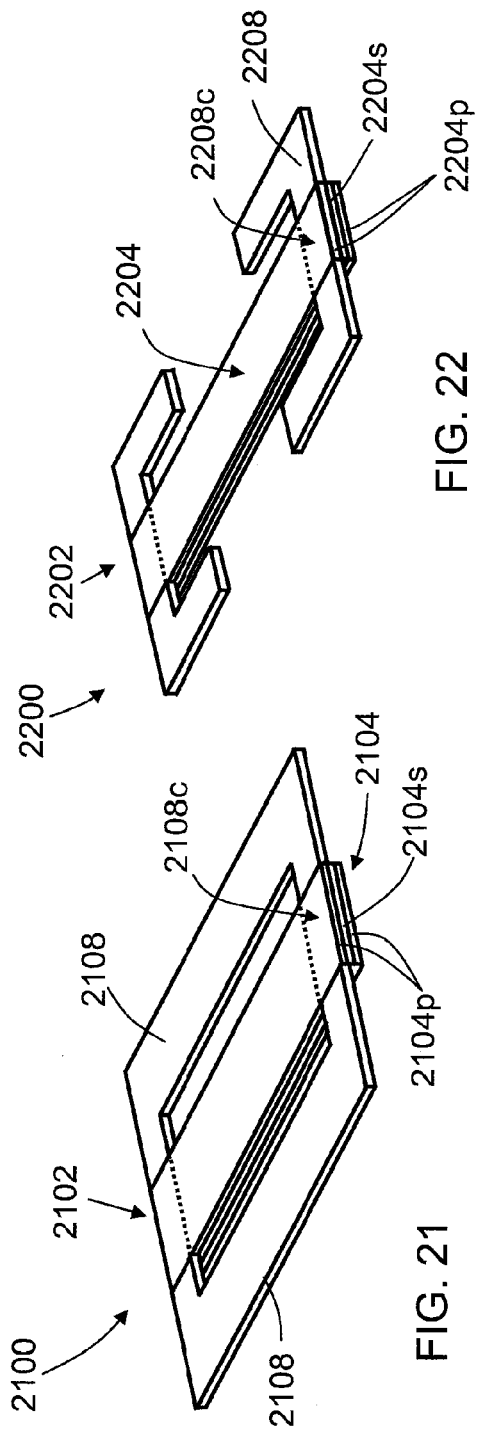
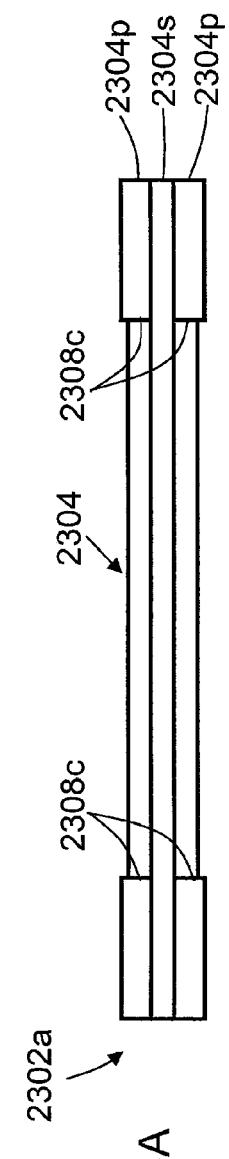
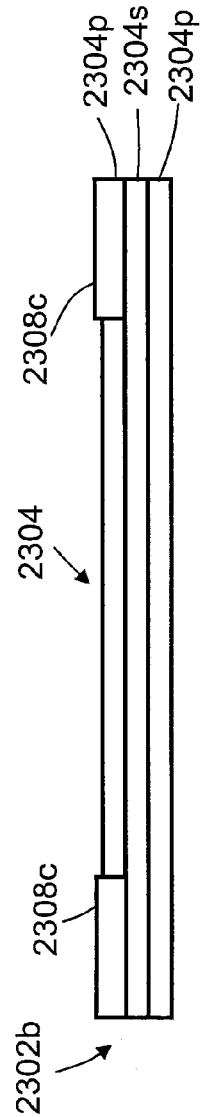
FIG. 21
FIG. 22
FIG. 23A
FIG. 23B

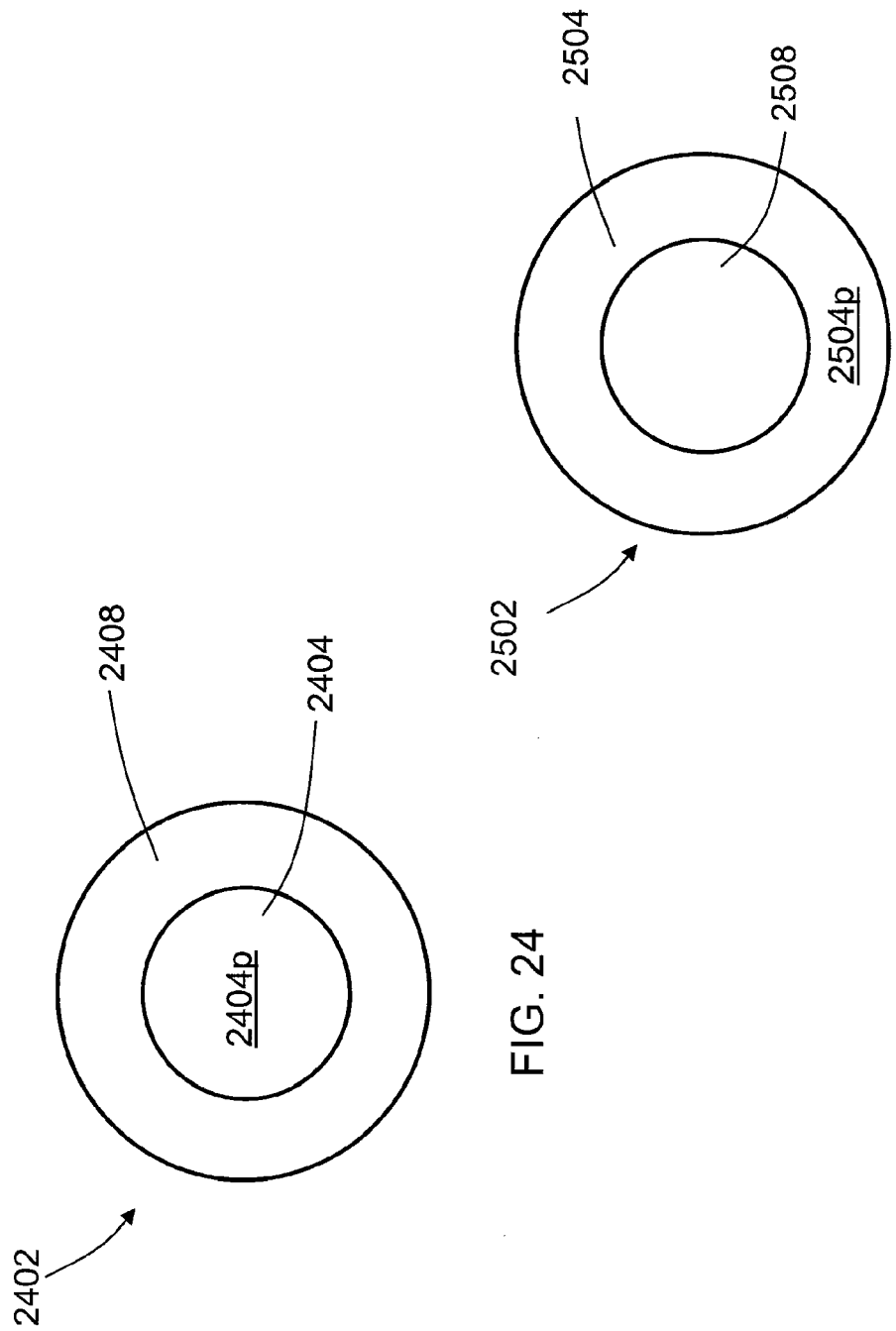

PIEZO BASED INERTIA ACTUATOR FOR HIGH DEFINITION HAPTIC FEEDBACK

CROSS-REFERENCE TO RELATED APPLICATIONS

This application claims the benefit of priority from U.S. Provisional Patent Application No. 61/409,467, filed Nov. 2, 2010, and U.S. Provisional Patent Application No. 61/415,609, filed Nov. 19, 2010, the entire contents of both of which are incorporated herein by reference.

FIELD

The present invention is related to a piezo based inertia actuator for high definition haptic feedback.

BACKGROUND

Electronic device manufacturers strive to produce a rich interface for users. Conventional electronic devices often provide visual and/or auditory feedback to communicate information to users. In some cases, kinesthetic feedback (such as active and resistive force feedback) and/or tactile feedback (such as vibration, texture, and heat) may also be provided to the user to enhance the user experience. Generally speaking, kinesthetic feedback and tactile feedback are collectively known as "haptic feedback" or "haptic effects." Haptic feedback may be useful for providing cues to alert the user of specific events or to provide realistic feedback sensations to create a greater sensory experience. Haptic feedback can be used with common electronic devices and even devices used for creating a simulated or virtual environment.

Various haptic actuation technologies have been used in the past to provide vibrotactile haptic feedback to touch sensitive devices, such as touch screens. Known haptic feedback devices use electric actuators, such as Linear Resonant Actuator ("LRA") devices and Eccentric Rotating Mass ("ERM") devices. However, these actuators usually have very limited bandwidth to perform sufficiently in haptic applications.

Another conventional haptic feedback technology in touch sensitive devices is electro-active polymer ("EAP") devices. One drawback of this technology, however, is that EAP-based actuators normally require thousands of volts of electricity to provide effects that are suitable for haptic applications.

Development of haptic feedback structures has led to smaller, more compact devices. As display screens having high definition have increased, so has the need for high definition haptic feedback.

SUMMARY

According to an aspect of the invention, there is provided a haptic device that includes an elongated piezo bender supported by a first holder and a second holder. The first holder and the second holder are spaced apart from each other and located at or near opposite ends of the elongated piezo bender. The haptic device also includes a mass supported by the elongated piezo bender and positioned in between the first holder and the second holder. The mass has a non-uniform thickness in a direction along a major axis of the elongated piezo bender. The haptic device also includes an electrical driving signal generator configured to generate a signal to create a vibration in the elongated piezo bender.

According to an aspect of the invention, there is provided a haptic device that includes an elongated piezo bender having a first end and a second end, a first holder configured to support the elongated piezo bender, and a second holder configured to support the elongated piezo bender. The first holder and the second holder are configured to vary a holding distance in between the first holder and the second holder to adjust a natural frequency of the haptic device. The haptic device also includes a mass supported by the elongated piezo bender, and an electrical driving signal generator configured to generate a signal to create a vibration in the elongated piezo bender.

According to an aspect of the invention, there is provided a haptic device that includes an elongated piezo bender supported by a first holder and a second holder. The first holder and the second holder are spaced apart from each and located at or near opposite ends of the elongated piezo bender. The haptic device also includes a mass supported by the elongated piezo bender and positioned in between the first holder and the second holder. The mass has a non-uniform thickness in a direction along a minor axis of the elongated piezo bender so that portions of the mass at least partially surround the elongated piezo bender. The haptic device also includes an electrical driving signal generator configured to generate a signal to create a vibration in the elongated piezo bender.

According to an aspect of the invention, there is provided a haptic device that includes an elongated piezo bender supported by a first holder and a second holder. The first holder and the second holder are spaced apart from each and located at or near opposite ends of the elongated piezo bender. The elongated piezo bender includes a substrate, a first layer of piezo material disposed on a first side of the substrate, and a second layer of piezo material disposed on a second side of the substrate that is opposite the first side. A mass is supported by the elongated piezo bender and positioned in between the first holder and the second holder. The mass has a connection portion embedded in the first layer of piezo material. The haptic device also includes an electrical driving signal generator configured to generate a signal to create a vibration in the elongated piezo bender.

According to an aspect of the invention, there is provided a haptic device that includes an elongated piezo bender supported by a holder. The elongated piezo bender includes a substrate, a first layer of piezo material on a first side of the substrate, and a second layer of piezo material on a second side of the substrate. A mass is supported by the elongated piezo bender. The mass has a connection portion embedded in the first layer of piezo material at a first end of the elongated piezo bender. The haptic device also includes an electrical driving signal generator configured to generate a signal to create a vibration in the elongated piezo bender.

According to an aspect of the invention, there is provided a haptic device that includes a piezo actuator supported by a holder. The piezo actuator includes a substrate, a first layer of piezo material on a first side of the substrate, and a second layer of piezo material on a second side of the substrate. A mass includes a connection portion embedded in the first layer of piezo material. The mass substantially surrounds the piezo actuator. The haptic device also includes an electrical driving signal generator configured to generate a signal to create a vibration in the piezo actuator.

According to an aspect of the invention, there is provided a haptic device that includes a piezo actuator supported by a holder. The piezo actuator includes a substrate, a first layer of piezo material on a first side of the substrate, and a second layer of piezo material on a second side of the substrate. A mass includes a connection portion embedded in the first layer of piezo material. The piezo actuator substantially surrounds the mass. The haptic device also includes an electrical driving signal generator configured to generate a signal to create a vibration in the piezo actuator.

According to an aspect of the invention, there is provided a haptic device that includes a piezo actuator having a shape of a cross. Each tip of the cross is supported by a holder. The piezo actuator includes a substrate, a first layer of piezo material on a first side of the substrate, and a second layer of piezo material on a second side of the substrate. A mass includes a connection portion embedded in the first layer of piezo material at a center of the piezo actuator. The haptic device also includes an electrical driving signal generator configured to generate a signal to create a vibration in the piezo actuator.

According to an aspect of the invention, there is provided a haptic device that includes a piezo actuator comprising a substrate, a first layer of piezo material on a first side of the substrate, and a second layer of piezo material on a second side of the substrate, a mass having at least a portion embedded in the first layer of piezo material, and an electrical driving signal generator configured to generate a signal to create a vibration in the piezo actuator.

The embodiments described in the present disclosure may include various features and advantages, which may not necessarily be expressly disclosed herein but will be apparent to one of ordinary skill in the art upon examination of the following detailed description and accompanying drawings. It is intended that these features and advantages be included within the present disclosure.

BRIEF DESCRIPTION OF THE DRAWINGS

The components of the following figures are illustrated to emphasize the general principles of the present disclosure and are not necessarily drawn to scale. Reference characters designating corresponding components are repeated as necessary throughout the figures for the sake of consistency and clarity.

FIG. 2 is a schematic cross-sectional view of a haptic device according to an embodiment of the invention;

FIG. 3 is a schematic cross-sectional view of a haptic device according to an embodiment of the invention;

FIG. 4 is a schematic cross-sectional view of a haptic device according to an embodiment of the invention;

FIG. 5 is a schematic cross-sectional view of a haptic device according to an embodiment of the invention;

FIG. 6 is a schematic cross-sectional view of a haptic device according to an embodiment of the invention;

FIG. 7 is a perspective view of a portion of the haptic device of FIG. 6;

FIG. 8 is a schematic cross-sectional view of a haptic device according to an embodiment of the invention;

FIG. 9 is a perspective view of a portion of the haptic device of FIG. 8;

FIG. 10 is a schematic top view of an embodiment of the electronic device of FIG. 1 with the haptic device of FIG. 8 in a first orientation;

FIG. 11 is a schematic top view of an embodiment of the electronic device of FIG. 1 with the haptic device of FIG. 8 in a second orientation that is about 90° from the first orientation;

FIG. 16 is a schematic cross-sectional view of a haptic device according to an embodiment of the invention;

FIG. 17 is a schematic cross-sectional view of a haptic device according to an embodiment of the invention;

FIG. 18 is a schematic perspective view of a portion of a haptic device according to an embodiment of the invention;

FIG. 19 is a schematic perspective view of a portion of a haptic device according to an embodiment of the invention;

FIG. 20A is a schematic cross-sectional view of an inertia actuator that may be used in the haptic device of FIGS. 18 and 19;

FIG. 20B is a schematic cross-sectional view of an inertia actuator that may be used in the haptic device of FIGS. 18 and 19;

FIG. 21 is a schematic perspective view of a portion of a haptic device according to an embodiment of the invention;

FIG. 22 is a schematic perspective view of a portion of a haptic device according to an embodiment of the invention;

FIG. 23A a schematic cross-sectional view of an inertia actuator that may be used in the haptic device of FIGS. 21 and 22;

FIG. 23B a schematic cross-sectional view of an inertia actuator that may be used in the haptic device of FIGS. 21 and 22;

FIG. 24 is a schematic top view of a portion of a haptic device according to an embodiment of the invention;

FIG. 25 is a schematic top view of a portion of a haptic device according to an embodiment of the invention.

DETAILED DESCRIPTION

The present disclosure describes embodiments of haptic devices that include haptic feedback actuators that impose haptic effects on a user via a user interface, human-computer interface, or other portions of a user device on which or within which the actuators reside. In particular, the embodiments of the haptic devices described herein can be configured to apply haptic effects to a touch sensitive surface of a user device. The touch sensitive surface, in some embodiments, can be part of a display device that may include both a visual output mechanism and a touch sensitive input mechanism. Thus, haptic feedback can be applied in user devices, such as electronic handheld devices, for providing a rich sensory experience for the user.

Although many of the examples described herein relate to touch screen devices, it should be understood that the present disclosure also encompasses other types of human-computer interfaces involving touch sensitive structures. In addition, other features and advantages will be apparent to one of ordinary skill in the art upon reading and understanding the general principles of the present disclosure. These other features and advantages are intended to be included in the present disclosure as well.

Figure 1:
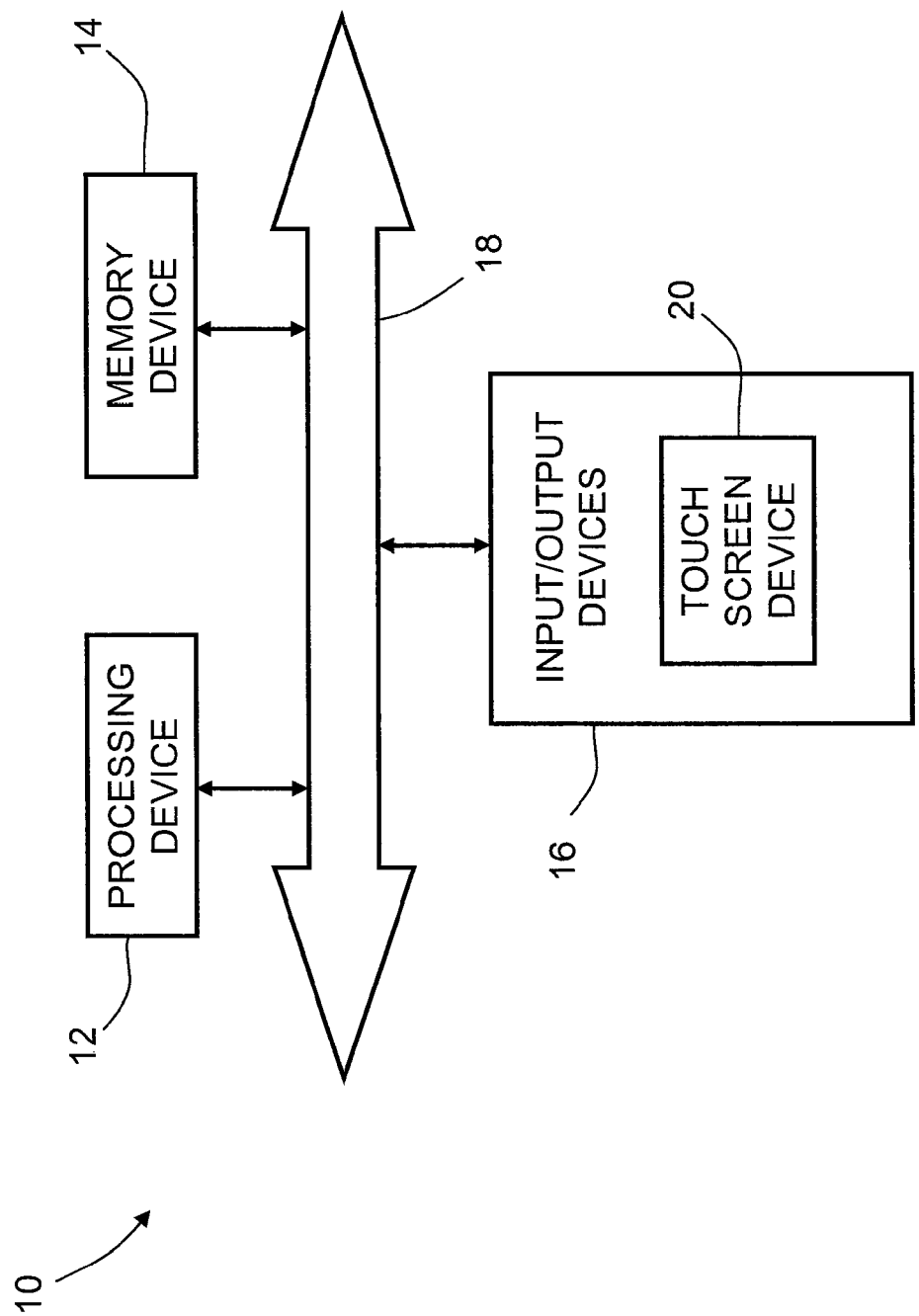
FIG. 1 is a block diagram showing a general schematic of an electronic device, according to embodiments of the invention.

FIG. 1 is a block diagram of an electronic device 10 in accordance with one embodiment. More particularly, the electronic device 10 includes a processing device 12, a memory device 14, and input/output devices 16, which are interconnected via a bus 18. Furthermore, the input/output devices 16 include a touch screen device 20 or other human-computer interface devices.

The touch screen device 20 may be configured as any suitable human-computer interface or touch/contact surface assembly. The touch screen device 20 may be any touch screen, touch pad, touch sensitive structure, computer monitor, laptop display device, workbook display device, kiosk screen, portable electronic device screen, or other suitable touch sensitive device. The touch screen device 20 may be configured for physical interaction with a user-controlled device, such as a stylus, finger, etc. In some embodiments, the touch screen device 20 may include at least one output device and at least one input device. For example, the touch screen device 20 might include a visual display and a touch sensitive screen superimposed thereon to receive inputs from a user's finger. The visual display may include a high definition display screen.

In various embodiments, the touch screen device 20 provides haptic feedback to at least a portion of the electronic device 10, which can be conveyed to a user in contact with the electronic device 10. Particularly, the touch screen device 20 can provide haptic feedback to the touch screen itself to impose a haptic effect when the user in is contact with the screen. The haptic effects can be used to enhance the user experience, and particularly can provide a confirmation to the user that the user has made sufficient contact with the screen to be detected by the touch screen device 20.

The electronic device 10 may be any device, such as a desk top computer, laptop computer, electronic workbook, electronic handheld device (such as a mobile phone, gaming device, personal digital assistant ("PDA"), portable e-mail device, portable Internet access device, calculator, etc.), kiosk (such as an automated teller machine, ticking purchasing machine, etc.), printer, point-of-sale device, game controller, or other electronic device.

The processing device 12 may be a general-purpose or specific-purpose processor or microcontroller for managing or controlling the operations and functions of the electronic device 10. For example, the processing device 12 may be specifically designed as an application-specific integrated circuit ("ASIC") to control output signals to a driver of the input/output devices 16 to provide haptic effects. The processing device 12 may be configured to decide, based on predefined factors, what haptic effects are to be played, the order in which the haptic effects are played, and the magnitude, frequency, duration, and/or other parameters of the haptic effects. The processing device 12 can also be configured to provide streaming motor commands that can be used to drive the haptic actuators for providing a particular haptic effect. In some embodiments, the processing device 12 may actually include a plurality of processors, each configured to perform certain functions within the electronic device 10.

The memory device 14 may include one or more internally fixed storage units, removable storage units, and/or remotely accessible storage units. The various storage units may include any combination of volatile memory and non-volatile memory. The storage units may be configured to store any combination of information, data, instructions, software code, etc. More particularly, the storage devices may include haptic effect profiles, instructions for how the haptic actuation devices of the input/output devices 16 are to be driven, or other information for generating haptic effects.

In addition to the touch screen device 20, the input/output devices 16 may also include specific input mechanisms and output mechanisms. For example, the input mechanisms may include such devices as keyboards, keypads, cursor control devices (e.g., computer mice), or other data entry devices. Output mechanisms may include a computer monitor, virtual reality display device, audio output device, printer, or other peripheral devices. The input/output devices 16 may include mechanisms that are designed to not only receive input from a user and but also provide feedback to the user, such as many examples of touch screen devices. The touch screen device 20 and other input/out devices 16 may include any suitable combination and configuration of buttons, keypads, cursor control devices, touch screen components, stylus-receptive components, or other data entry components. The touch screen device 20 may also include any suitable combination of computer monitors, display screens, touch screen displays, haptic or tactile actuators, haptic effect devices, or other notification devices for providing output to the user.

FIG. 2 illustrates an embodiment of a haptic device 200 that may be used as part of the input/output devices 16 of FIG. 1. As illustrated, the haptic device 200 includes an inertia actuator 202 that includes a piezo bender 204 having a thin elongated body that is supported at or near each end by a holder 206 that is configured to hold the piezo bender 204 in a manner that restrains movement of the portion of the piezo bender 204 being held. Piezo benders are known in the art and generally include at least one layer of piezo ceramic material and at least one layer of a metal substrate. A mass 208 may be centrally positioned on the piezo bender 204 in between the holders 206. In an embodiment, the holders 206 may be in flat surface contact with the substrate of the piezo bender. In an embodiment, the holders 206 may be in line contact, instead of flat surface contact, with the piezo ceramic material of the piezo bender 204, as represented by the triangular cross-sectional shapes of the holders 206 in FIG. 2. As illustrated in FIG. 2, the piezo bender 204 may be connected to an electrical driving circuit 210 that is configured to generate an electrical driving signal based on an input signal. When the electrical driving signal is applied to the piezo bender 204 across two surfaces of the piezo bender 204, the piezo bender 204 will begin to deflect. By varying the frequency of the electrical driving signal, the piezo bender 204 will vibrate. The frequency and amplitude of the driving signal provided by the driving circuit 210, the natural mechanical resonant frequency of the piezo bender 204, the distance between the holders 206, and the location and size of the mass 208 will control the frequency and amplitude of the vibration of the piezo bender 204 and haptic effect provided by the haptic device. In an embodiment, the mass 208 may be up to about a 10 gram mass, and may be placed on the piezo bender 204 in between the holders 206 so that the mass 208 is centered between the holders 206. The mass 208 may be connected to the piezo bender 204 by any suitable means, such as with an adhesive.

FIG. 3 illustrates an embodiment of a haptic device 300 that may be used as part of the input/output devices 16 of FIG. 1. As illustrated, the haptic device 300 includes an inertia actuator 302 that includes a piezo bender 304 having a thin elongated body that is supported at or near each end by a holder 306. In an embodiment, the holders 306 may be in flat surface contact with the substrate of the piezo bender. In an embodiment, the holders 306 may be in line contact, instead of flat surface contact, with the piezo ceramic material of the piezo bender 304, as represented by the triangular cross-sectional shapes of the holders 306 in FIG. 3. Instead of having a single mass, like the single mass 208 of FIG. 2, a pair of masses 308 may be positioned on opposite sides of the piezo bender 304 in between the holders 306. The piezo bender 304 is connected to an electrical driving circuit (not shown in FIG. 3), that may be configured like the electrical driving circuit 210 of FIG. 2 to generate a haptic effect based on an input signal. In an embodiment, the masses 308 may be connected to the piezo bender 304 in between the holders 306 so that the masses 308 are centered between the holders 306. The masses 308 may be rigidly connected to the piezo bender 304 with corresponding rigid connectors 312. The overall size of the haptic device 300 of FIG. 3 may be thinner than the haptic device 200 of FIG. 2 due to the use and shape of the two masses 308.

FIG. 4 illustrates an embodiment of a haptic device 400 that may be used as part of the input/output devices 16 of FIG. 1. As illustrated, the haptic device 400 includes an inertia actuator 402 that includes a piezo bender 404 having a thin elongated body that is supported at or near each end by a holder 406. In an embodiment, the holders 406 may be in flat surface contact with the substrate of the piezo bender. In an embodiment, the holders 406 may be in line contact, instead of flat surface contact, with the piezo ceramic material of the piezo bender 404, as represented by the triangular cross-sectional shapes of the holders 406 in FIG. 4. A single mass 408 may be supported by the piezo bender 404 centrally in between the holders 406. The piezo bender 404 is connected to an electrical driving circuit (not shown in FIG. 4), that may be configured like the electrical driving circuit 210 of FIG. 2 to generate a haptic effect based on an input signal. In the embodiment illustrated in FIG. 4, the mass 408 is shaped so that it has a non-uniform thickness in a direction along a major axis of the elongated piezo bender 404 such that it is thicker in the center and thinner at the ends closest to the holders 406. The mass 408 may be rigidly connected to the piezo bender 404 with any suitable means, such as with an adhesive. It is expected that for a small actuator, the unevenly distributed mass will not affect the performance of the actuator. By using the uneven thickness design, it is expected that the total thickness of the actuator 402 may be significantly reduced, as compared to the thickness of the actuators 202, 302 illustrated by FIGS. 2 and 3, respectively. The shape of the mass 408 is not limited to the triangular shape illustrated in FIG. 4. For example, the mass 408 may have any shape that has a low profile and does not significantly affect the bending of the piezo bender 404, such as an arc. In an embodiment, the mass may be less than about 5 grams, such as about 3.5 grams.

FIG. 5 illustrates an embodiment of a haptic device 500 that may be used as part of the input/output devices 16 of FIG. 1. As illustrated, the haptic device 500 includes an inertia actuator 502 that includes a piezo bender 504 having a thin elongated body that is supported at or near each end by a holder 506. In an embodiment, the holders 506 may be in flat surface contact with the substrate of the piezo bender. In an embodiment, the holders 506 may be in line contact, instead of flat surface contact, with the piezo ceramic material of the piezo bender 504, as represented by the triangular cross-sectional shapes of the holders 506 in FIG. 5. In the embodiment illustrated in FIG. 5 a single mass 508 may be rigidly connected to the piezo bender 504 via a rigid connector 512 located centrally in between the holders 506. The piezo bender 504 is connected to an electrical driving circuit (not shown in FIG. 5), that may be configured like the electrical driving circuit 210 of FIG. 2 to generate a haptic effect based on an input signal. In an embodiment, a pair of dampers 514 may be positioned near each end of the mass 508. Instead of, or in addition to dampers that may be placed between the mass and housing for the haptic device, or between the actuator and the housing of the haptic device module, the dampers 514 are positioned between the mass 508 and the piezo bender 504. The dampers 514 may be used to damp out any ringing effect of the actuator 502 without significantly impacting the performance of the actuator 502. In addition, the dampers 514 may provide additional support for the mass 508, as illustrated.

FIGS. 6 and 7 illustrate an embodiment of a haptic device 600 that may be used as part of the input/output devices 16 of FIG. 1. As illustrated, the haptic device 600 includes an inertia actuator 602 that includes a piezo bender 604 having a thin elongated body that is supported at or near each end by a holder 606. In an embodiment, the holders 606 may be in flat surface contact with the substrate of the piezo bender. In an embodiment, the holders 606 may be in line contact, instead of flat surface contact, with the piezo ceramic material of the piezo bender 604, as represented by the triangular cross-sectional shapes of the holders 606 in FIG. 6. In the embodiment illustrated in FIGS. 6 and 7 a pair of masses 608 may be rigidly connected to the piezo bender 604 via rigid connectors 612 located centrally in between the holders 606 on opposite sides of the piezo bender 604. The piezo bender 604 is connected to an electrical driving circuit (not shown in FIG. 6), that may be configured like the electrical driving circuit 210 of FIG. 2 to generate a haptic effect based on an input signal. In an embodiment, a pair of dampers 614 may be positioned near each end of each mass 608. Similar to the dampers 514 of the haptic device 500 of FIG. 5, the dampers 614 may be used to damp out any ringing effect of the actuator 602 without significantly impacting the performance of the actuator 602. In addition, the dampers 614 may provide additional support for the masses 608, as illustrated.

FIGS. 8 and 9 illustrate an embodiment of a haptic device 800 that may be used as part of the input/output devices 16 of FIG. 1. As illustrated, the haptic device 800 includes an inertia actuator 802 that includes a piezo bender 804 having a thin elongated body that is supported at or near each end by a holder 806. In an embodiment, the holders 806 may be in flat surface contact with the substrate of the piezo bender. In an embodiment, the holders 806 may be in line contact, instead of flat surface contact, with the piezo ceramic material of the piezo bender 804, as represented by the triangular cross-sectional shapes of the holders 806 in FIG. 8. A single mass 808 may be supported by the piezo bender 804 centrally in between the holders 806. The piezo bender 804 is connected to an electrical driving circuit (not shown in FIG. 8), that may be configured like the electrical driving circuit 210 of FIG. 2 to generate a haptic effect based on an input signal. In the embodiment illustrated in FIG. 8, the mass is shaped so that it is thicker in the center and thinner at the ends closest to the holders 806, i.e., has a non-uniform thickness in a direction of a major axis of the piezo bender 804. The mass 808 may be rigidly connected to the piezo bender 804 with any suitable means, such as with an adhesive. In an embodiment, a pair of dampers 814 may be positioned near each end of the mass 808. The dampers 814 may be used to damp out any ringing effect of the actuator 802 without significantly impacting the performance of the actuator 802. The dampers 814 may also provide additional support for the mass 808, as illustrated. FIG. 9 also illustrates a housing 816 for the haptic device 800 that is configured to contain the holders 806, the mass 808, the piezo bender 804 and the dampers 814 so that the haptic device 800 is in the form of a module that may be placed in the electronic device 10 of FIG. 1.

As schematically illustrated in FIG. 10, the haptic device 800 of FIG. 8 may be oriented within the electronic device 10 so that the piezo bender 804 moves substantially parallel to the major surface (defined as being in the x-y plane) of the electronic device 10 on which the haptic device 808 is installed. As illustrated in FIG. 10, the piezo bender 804 is oriented to generally move (represented by the double arrow) in the direction along the y axis. As illustrated in FIG. 11, the haptic device may be oriented within the electronic device 10 so that the piezo bender 804 moves substantially perpendicular to the major surface of the electronic device 10 on which the haptic device 800 is installed. As illustrated in FIG. 11, the piezo bender 804 is oriented to move (represented by the double arrow) in the direction along the z axis. For embodiments in which a haptic device is oriented as illustrated by FIG. 11, it is desirable to minimize the height of the haptic device in the direction of the movement so that the electronic device may be as thin as possible.

Figure 12:
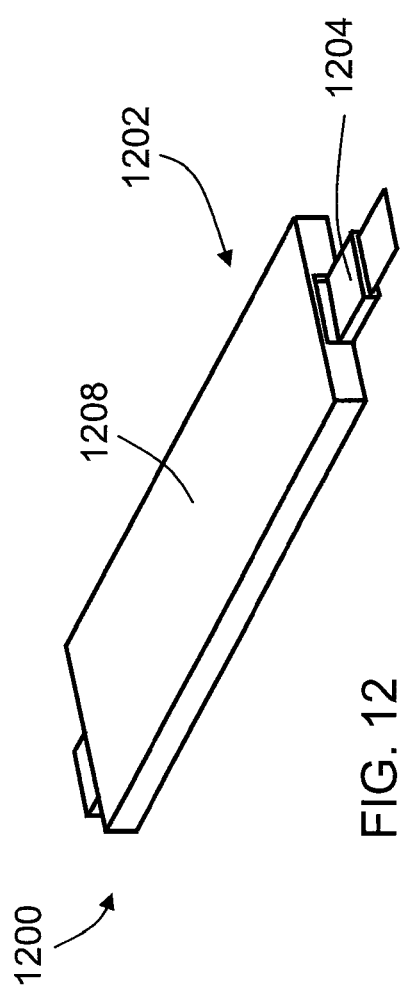
FIG. 12 is a perspective view of a portion of a haptic device according to an embodiment of the invention.
Figure 13:
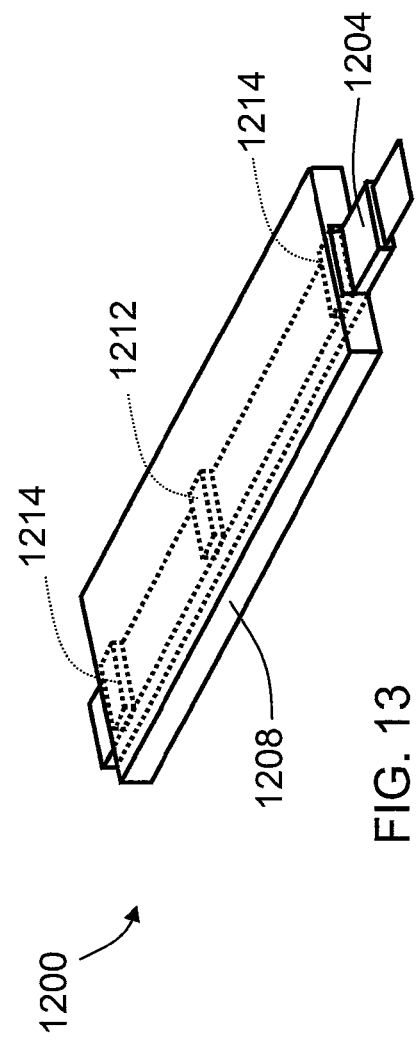
FIG. 13 is a perspective view of the portion of the haptic device of FIG. 12 showing internal features of the device.

FIGS. 12 and 13 illustrate an embodiment of a haptic device 1200 that may be used as part of the input/output devices 16 of FIG. 1, in embodiments in which the height dimension (i.e., the dimension in which the piezo bender moves) should be minimized as discussed above with respect to FIG. 11. As illustrated in FIGS. 12 and 13, the haptic device 1200 includes an inertia actuator 1202 that includes a piezo bender 1204 having a thin elongated body that is configured to be supported at each end by a holder (not shown in FIGS. 12 and 13). A mass 1208 may be rigidly connected to the piezo bender 1208 via a rigid connector 1212 located centrally in between the holding locations. As illustrated, the majority of the mass 1208 is positioned on opposite sides of the piezo bender 1204 so that the mass 1208 has a very thin profile in the direction of movement of the piezo bender 1204, and also has a cross-sectional C-shape in a direction along a minor axis of the piezo bender 1204. The piezo bender 1204 is connected to an electrical driving circuit (not shown in FIGS. 12 and 13), that may be configured like the electrical driving circuit of FIG. 2 to generate a haptic effect based on an input signal. In an embodiment, a pair of dampers 1214 may be positioned near each end of the mass 1208, as illustrated in FIG. 13. Similar to the dampers 514 of the haptic device 500 of FIG. 5, the dampers 1214 may be used to damp out any ringing effect of the actuator 1202 without significantly impacting the performance of the actuator 1202. In addition, the dampers 1214 may provide additional support for the mass 1208, as illustrated.

Figure 14:
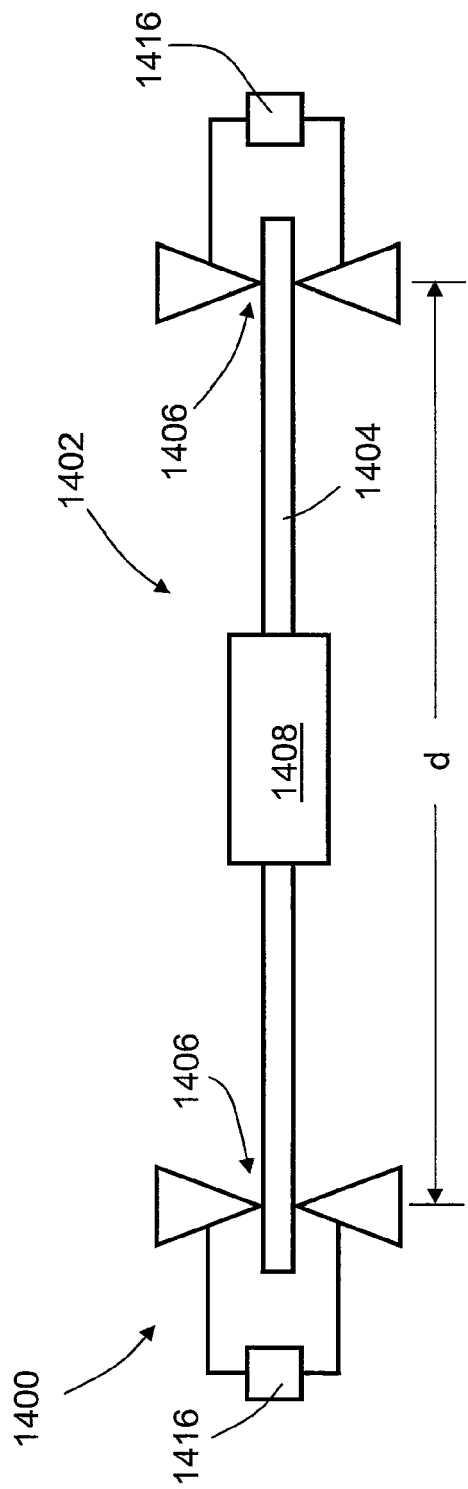
FIG. 14 is a schematic cross-sectional view of a haptic device according to an embodiment of the invention.

FIG. 14 illustrates an embodiment of a haptic device 1400 that may be used as part of the input/output devices 16 of FIG. 1. As illustrated, the haptic device 1400 includes an inertia actuator 1402 that includes a piezo bender 1404 having a thin elongated body that is supported at each end by a holder 1406. In an embodiment, the holders 1406 may be in flat surface contact with the substrate of the piezo bender. In an embodiment, the holders 1406 may be in line contact, instead of flat surface contact, with the piezo ceramic material of the piezo bender 1404, as represented by the triangular cross-sectional shapes of the holders 1406 in FIG. 14. In the embodiment illustrated in FIG. 14 a single mass 1408 may be connected to the piezo bender 1404 by suitable means in between the holders 1406. The piezo bender 1404 is connected to an electrical driving circuit (not shown in FIG. 14), that may be configured like the electrical driving circuit of FIG. 2 to generate a haptic effect based on an input signal. In order to vary the resonant frequency of the actuator 1402, the holding distance d, which is defined as the distance between the holders 1406, may be varied. In an embodiment, the holding distance d may be about 40 mm to achieve a first resonant frequency, and may be about 35 mm to achieve a second resonant frequency. In other words, the holding distance d may be varied to adjust a natural frequency of the haptic device 1400. As illustrated in FIG. 14, each holder 1406 is connected to an actuator 1416 that is configured to move the holder along the piezo bender 1404 to change the holding distance d, which will change the resonant frequency of the actuator 1402.

Figure 15:
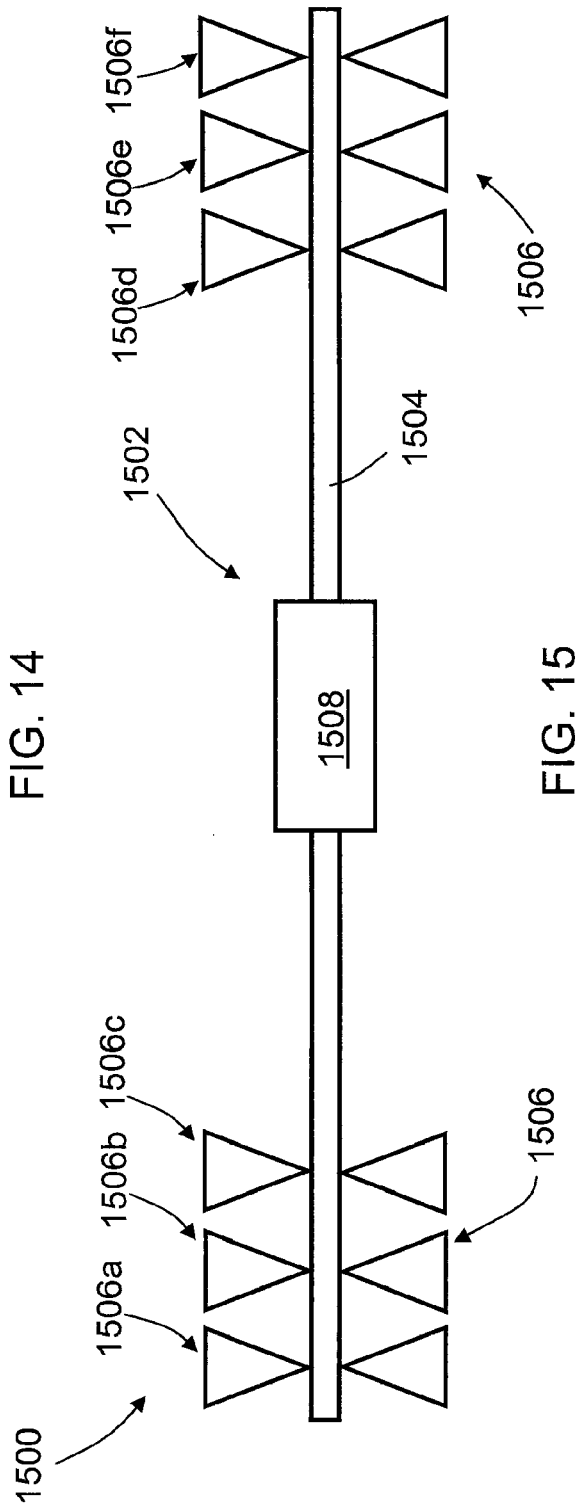
FIG. 15 is a schematic cross-sectional view of a haptic device according to an embodiment of the invention.

FIG. 15 illustrates an embodiment of a haptic device 1500 that may be used as part of the input/output devices 16 of FIG. 1. As illustrated, the haptic device 1500 includes an inertia actuator 1502 that includes a piezo bender 1504 having a thin elongated body that is supported at each end by a holder 1506. In an embodiment, the holders 1506 may be in flat surface contact with the substrate of the piezo bender. In an embodiment, the holders 1506 may be in line contact, instead of flat surface contact, with the piezo ceramic material of the piezo bender 1504, as represented by the triangular cross-sectional shapes of the holders 1506 in FIG. 15. In the embodiment illustrated in FIG. 15, there are three holders 1506*a*, 1506*b*, 1506*c* located on one side of a mass 1508, and three holders 1506*d*, 1506*e*, 1506*f* located on the other side of the mass 1508 along the piezo bender 1504. In an embodiment, only one of the three holders 1506*a*, 1506*b*, 1506*c* and only one of the three holders 1506*d*, 1506*e*, 1506*f* are used at a single time as the holders 1506. In order to vary the resonant frequency of the actuator 1502, different combinations of the holders 1506*a*, 1506*b*, 1506*c* and the holders 1506*d*, 1506*e*, 1506*f* may be used to vary the holding distance between the holders 1506, which will change the resonant frequency of the actuator 1502.

FIG. 16 illustrates an embodiment of a haptic device 1600 that may be used as part of the input/output devices 16 of FIG. 1. As illustrated, the haptic device 1600 includes an inertia actuator 1602 that includes a piezo bender 1604 having a thin elongated body that is supported at one end by a holder 1606*a* and at another location by a holder 1606*b*. In an embodiment, the holders 1606*a*, 1606*b* may be in flat surface contact with the substrate of the piezo bender. In an embodiment, the holders 1606*a*, 1606*b* may be in line contact, instead of flat surface contact, with the piezo ceramic material of the piezo bender 1604, as represented by the triangular cross-sectional shapes of the holders 1606*a*, 1606*b* in FIG. 16. In the embodiment illustrated in FIG. 16 a single mass 1608 may be connected to the piezo bender 1604 by suitable means at one end of the piezo bender 1604. The piezo bender 1604 is connected to an electrical driving circuit (not shown in FIG. 16), that may be configured like the electrical driving circuit of FIG. 2 to generate a haptic effect based on an input signal. The position of the holders 1606*a*, 1606*b* may be varied to adjust a natural frequency of the haptic device 1600 by connecting the holders 1606*a*, 1606*b* to suitable actuators (not shown) similar to the actuators 1416 illustrated in FIG. 14. The embodiment of the haptic device 1600 illustrated in FIG. 16 may provide a low frequency domain.

FIG. 17 illustrates an embodiment of a haptic device 1700 that may be used as part of the input/output devices 16 of FIG. 1. As illustrated, the haptic device 1700 includes an inertia actuator 1702 that includes a piezo bender 1704 having a thin elongated body that is supported at or near its center by a holder 1706 that is configured to support the piezo bender 1704 in a manner that restrains movement of the portion of the piezo bender 1704 being held. In an embodiment, the holder 1706 may be in flat surface contact with the substrate of the piezo bender. In an embodiment, the holder 1706 may be in line contact, instead of flat surface contact, with the piezo ceramic material of the piezo bender 1704, as represented by the triangular cross-sectional shapes of the holders 1706 in FIG. 17. A mass 1708 may be positioned on the piezo bender 1704 at each end of the piezo bender 1704. The mass 1708 may be a single mass that surrounds the piezo bender 1704, similar to the embodiment illustrated in FIG. 21, or the mass 1708 may be in two pieces, similar to the embodiment illustrated in FIG. 22. The piezo bender 1704 may be connected to an electrical driving circuit (not shown in FIG. 17) that is configured to generate an electrical driving signal based on an input signal. When the electrical driving signal is applied to the piezo bender 1704 across two surfaces of the piezo bender 1704, the piezo bender 1704 will begin to deflect. By varying the frequency of the electrical driving signal, the piezo bender 1704 will vibrate. The frequency and amplitude of the driving signal provided by the driving circuit, the natural mechanical resonant frequency of the piezo bender 1704, and the location of the attachment points and size of the mass 1708 will control the frequency and amplitude of the vibration of the piezo bender 1704 and haptic effect provided by the haptic device 1700.

FIG. 18 illustrates an embodiment of a haptic device 1800 that may be used as part of the input/output devices 16 of FIG. 1. As illustrated, the haptic device 1800 includes an inertia actuator 1802 that includes a piezo bender 1804 having a thin elongated body that is supported at each end by a holder (not shown in FIG. 18) that is configured to support the piezo bender 1804 in a manner that restrains movement of the portion of the piezo bender 1804 being held. The piezo bender 1804 includes a center substrate 1804s, which may be made of metal, and two layers of piezo ceramic material 1804p on opposite sides of the substrate 1804s. A mass 1808 is connected to the piezo bender 1804 at or near the center of the piezo bender 1804 and extends away from the piezo bender 1804 on opposite of and substantially parallel to the piezo bender, as illustrated in FIG. 18. A connection portion of the mass 1808c is embedded in the layer of piezo material 1804p in a manner that provides a thin profile for the actuator 1802, as well as a suitable connection between the mass 1808 and the piezo bender 1804, without substantially changing the performance of the layer of the piezo material 1804p. The term "embedded" as used herein is meant to include arrangements in which the connection portion of the mass is surrounded by the piezo material in the piezo layer, and also arrangements in which the connection portion is positioned in between the layer of piezo material and the substrate so that the piezo material substantially, but does not completely, surround the connection portion. The piezo bender 1804 may be connected to an electrical driving circuit (not shown in FIG. 18) that is configured to generate an electrical driving signal based on an input signal, so that a haptic effect may be generated by the haptic device 1800.

FIG. 19 illustrates an embodiment of a haptic device 1900 that may be used as part of the input/output devices 16 of FIG. 1. As illustrated, the haptic device 1900 includes an inertia actuator 1902 that includes a piezo bender 1904 having a thin elongated body that is supported at each end by a holder (not shown in FIG. 19) that is configured to support the piezo bender 1904 in a manner that restrains movement of the portion of the piezo bender 1904 being held. The piezo bender 1904 includes a center substrate 1904s, which may be made of metal, and two layers of piezo ceramic material 1904p on opposite sides of the substrate 1904s. A mass 1908 is connected to the piezo bender 1904 at or near the center of the piezo bender 1904 and is configured to surround the piezo bender 1904, as illustrated in FIG. 19. In an embodiment, the mass 1908 may not completely surround the piezo bender 1904, but may instead substantially surround the piezo bender. A connection portion of the mass 1908c is embedded in the layer of piezo material 1904p in a manner that provides a thin profile for the actuator 1902, as well as a suitable connection between the mass 1908 and the piezo bender 1904, without substantially changing the performance of the layer of the piezo material 1904p. The piezo bender 1904 may be connected to an electrical driving circuit (not shown in FIG. 19) that is configured to generate an electrical driving signal based on an input signal, so that a haptic effect may be generated by the haptic device 1900.

FIGS. 20A and 20B illustrate embodiments of an inertia actuator 2002a, 2002b, respectively, that may be used in the embodiments of the actuators 1802, 1902 of FIGS. 18 and 19. As illustrated in FIG. 20A, the actuator 2002a includes a piezo bender 2004 that includes a center substrate 2004s and two layers of piezo ceramic material 2004p disposed on opposite sides of the substrate 2004s, and a mass having a connection portion 2008c embedded in each of the layers of piezo material 2004p. As illustrated in FIG. 20B, the actuator 2002b includes the piezo bender 2004 of FIG. 20A, and a mass having a connection portion 2008c embedded in only one of the layers of piezo material 2004p.

FIG. 21 illustrates an embodiment of a haptic device 2100 that may be used as part of the input/output devices 16 of FIG. 1. As illustrated, the haptic device 2100 includes an inertia actuator 2102 that includes a piezo bender 2104 having a thin elongated body that is supported at or near its center by a holder (not shown in FIG. 21) that is configured to support the piezo bender 2104 in a manner that restrains movement of the portion of the piezo bender 2104 being held. The piezo bender 2104 includes a center substrate 2104s, which may be made of metal, and two layers of piezo ceramic material 2104p on opposite sides of the substrate 2104s. A mass 2108 is connected to the piezo bender 2104 at each end of the piezo bender 2104 and essentially surrounds the piezo bender 2104, as illustrated in FIG. 21. Connection portions of the mass 2108c are embedded in the layer of piezo material 2104p in a manner that provides a thin profile for the actuator 2102, as well as suitable connections between the mass 2108 and the piezo bender 2104, without substantially changing the performance of the layer of the piezo material 2104p. The piezo bender 2104 may be connected to an electrical driving circuit (not shown in FIG. 21) that is configured to generate an electrical driving signal based on an input signal, so that a haptic effect may be generated by the haptic device 2100.

FIG. 22 illustrates an embodiment of a haptic device 2200 that may be used as part of the input/output devices 16 of FIG. 1. As illustrated, the haptic device 2200 includes an inertia actuator 2202 that includes a piezo bender 2204 having a thin elongated body that is supported at or near its center by a holder (not shown in FIG. 22) that is configured to support the piezo bender 2204 in a manner that restrains movement of the portion of the piezo bender 2204 being held. The piezo bender includes a center substrate 2204s, which may be made of metal, and two layers of piezo ceramic material 2204p on opposite sides of the substrate 2204s. A mass 2208a, 2208b may be provided in two pieces 2208a, 2208b, each of which having a C-shape and partially extending along side of the piezo bender 2204. The mass 2208a, 2208b is connected to the piezo bender 2204 at each end of the piezo bender 2204, as illustrated in FIG. 22. Connection portions of the mass 2208c are embedded in the layer of piezo material 2204p in a manner that provides a thin profile for the actuator 2202, as well as suitable connections between the mass 2208a, 2208b and the piezo bender 2204, without substantially changing the performance of the layer of the piezo material 2204p. The piezo bender 2204 may be connected to an electrical driving circuit (not shown in FIG. 22) that is configured to generate an electrical driving signal based on an input signal, so that a haptic effect may be generated by the haptic device 2200.

FIGS. 23A and 23B illustrate embodiments of an inertia actuator 2302a, 2302b, respectively, that may be used in the embodiments of the actuators 2102, 2202 of FIGS. 21 and 22. As illustrated in FIG. 23A, the actuator 2302a includes a piezo bender 2304 that includes a center substrate 2304s and two layers of piezo ceramic material 2304p disposed on opposite sides of the substrate 2304s, and a mass having a connection portions 2308c embedded in each of the layers of piezo material 2304p. As illustrated in FIG. 23B, the actuator 2302b includes the piezo bender 2304 of FIG. 23A, and a mass having connection portions 2308c embedded in only one of the layers of piezo material 2304p.

FIG. 24 illustrates an embodiment of an inertia actuator 2402 that may be used as part of a haptic device of the input/output devices 16 of FIG. 1. As illustrated, the actuator 2402 has a substantially circular or disc shape and includes a piezo disc 2404 having a center substrate (not shown) and layers of a piezo ceramic material 2404p on opposite sides of the center substrate. The piezo disc 2404 of FIG. 24 may have a similar cross-section as the piezo benders discussed above, with the exception of the actual peripheral shape. As illustrated in FIG. 24, a mass 2408 surrounds the piezo disc 2404, and may be connected to the piezo disc 2404 by having a connection portion embedded in at least one of the layers of piezo material 2404.p in a similar manner as described in embodiments discussed above. A holder (not shown in FIG. 24) may be configured to hold a center portion of the piezo disc 2404, so that when the piezo disc 2404 is connected to an electrical driving circuit (not shown in FIG. 24) that is configured to generate an electrical driving signal based on an input signal, the piezo disc 2404 may vibrate so that a haptic effect may be generated by the actuator 2402.

FIG. 25 illustrates an embodiment of an inertia actuator 2502 that may be used as part of a haptic device of the input/output devices 16 of FIG. 1. As illustrated, the actuator 2502 has a substantially circular or disc shape and includes mass 2408 that is surrounded by a piezo ring 2504 having a center substrate (not shown) and layers of a piezo ceramic material 2504p on opposite sides of the center substrate. The piezo ring 2504 of FIG. 25 may have a similar cross-section (in terms of layers) as embodiments of the piezo bender discussed above. The mass 2508 may be connected to the piezo ring 2504 by having a connection portion embedded in at least one of the layers of piezo material 2504p in a similar manner as described in embodiments discussed above. A holder (not shown in FIG. 25) may be configured to hold an outer periphery of the piezo ring so that when the piezo ring 2504 is connected to an electrical driving circuit (not shown in FIG. 25) that is configured to generate an electrical driving signal based on an input signal, the piezo ring 2504 will vibrate so that a haptic effect may be generated by the actuator 2502.

Figure 26:
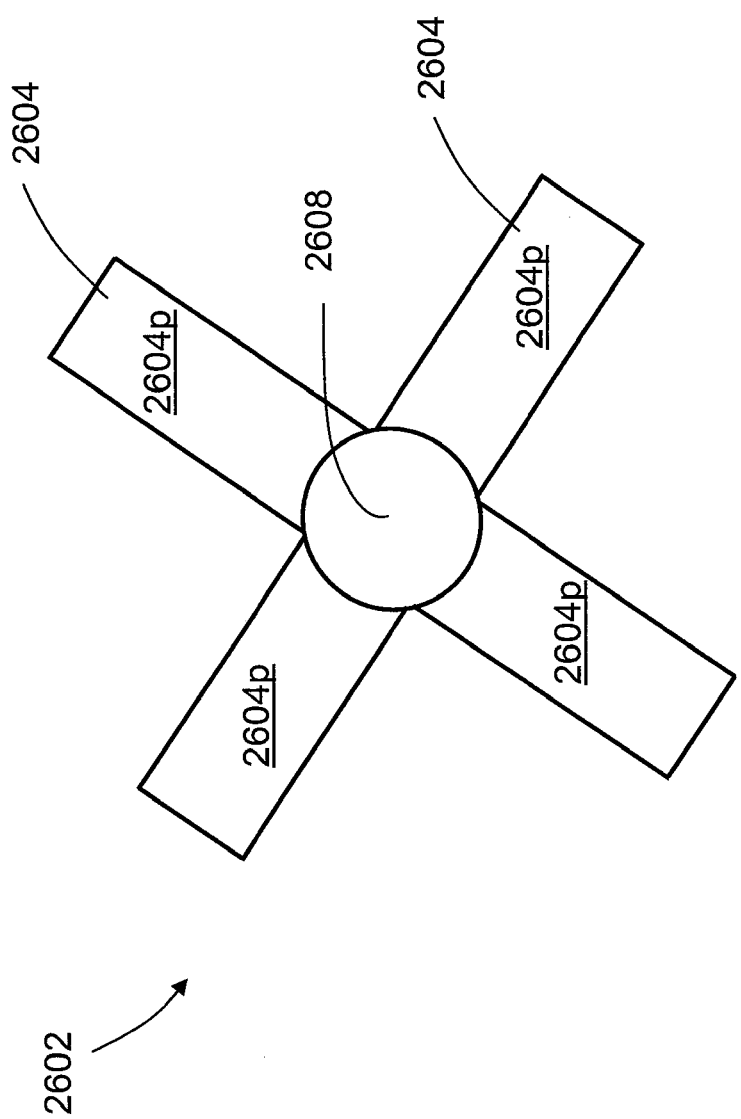
FIG. 26 is a schematic top view of a portion of a haptic device according to an embodiment of the invention.

FIG. 26 illustrates an embodiment of an inertia actuator 2602 that may be used as part of a haptic device of the input/output devices 16 of FIG. 1. As illustrated, the actuator 2602 may have a cross shape and includes a mass 2608 at the center of a piezo cross 2404 that includes a center substrate (not shown) and layers of a piezo ceramic material 2604p on opposite sides of the center substrate. The piezo cross 2604 of FIG. 26 may have a similar cross-section (in terms of layers) as embodiments of the piezo bender discussed above. The mass 2608 may be connected to the piezo cross 2604 by having a connection portion embedded in at least one of the layers of piezo material 2604p in a similar manner in the embodiments discussed above. A holder (not shown in FIG. 26) may be configured to hold each tip of the piezo cross 2504 so that when the piezo cross 2604 is connected to an electrical driving circuit (not shown in FIG. 26) that is configured to generate an electrical driving signal based on an input signal, the piezo cross 2604 will vibrate so that a haptic effect may be generated by the actuator 2602.

In alternative embodiments, other shapes for the piezo-based actuators may be used. The illustrated embodiments are not intended to be limiting in any way. In addition, the piezo materials, described herein may be replaced with other smart materials that are used in actuators, such as SMA. In an embodiment, the piezo-based actuators may also be configured to be sensors to sense an input from a user of the electronic device. Aspects of embodiments of the present invention may be used in other actuators, and not just for the resonant actuators of the haptic devices disclosed herein. In addition, aspects of embodiments of the present invention may provide an improved level of compatibility and performance, as compared to haptic devices known in the art, which may be suitable for high definition devices.

Embodiments of the present invention may be used as the actuation unit to enable haptic feedback in various electronic devices, such as touch screen handheld devices (mobile devices, PDA, and navigation systems), automotive applications, gaming consoles, etc.

The embodiments described herein represent a number of possible implementations and examples and are not intended to necessarily limit the present disclosure to any specific embodiments. Instead, various modifications can be made to these embodiments as would be understood by one of ordinary skill in the art. Any such modifications are intended to be included within the spirit and scope of the present disclosure and protected by the following claims.

What is claimed is:

1. A haptic device, comprising:
    an elongated piezo bender supported by a first holder and a second holder, the first holder and the second holder being spaced apart from each other and located at or near opposite ends of the elongated piezo bender;
    a mass supported by the elongated piezo bender and positioned in between the first holder and the second holder, the mass having a non-uniform thickness in a direction along a major axis of the elongated piezo bender;
    a pair of dampers, wherein each damper is located in between one end portion of the mass and the elongated piezo bender; and
    an electrical driving signal generator configured to generate a signal to create a vibration in the elongated piezo bender.

2. The haptic device according to claim 1, wherein the mass is thicker in a center portion and thinner in end portions in the direction along the major axis of the elongated piezo bender.

3. The haptic device according to claim 1, further comprising a first actuator configured to move the first holder towards and away from the second holder.

4. The haptic device according to claim 3, further comprising a second actuator configured to move the second holder towards and away from the first holder.

5. A haptic device, comprising:
    an elongated piezo bender having a first end and a second end;
    a first holder configured to support the elongated piezo bender;
    a second holder configured to support the elongated piezo bender, the first holder and the second holder being configured to vary a holding distance in between the first holder and the second holder to adjust a natural frequency of the haptic device;
    a mass supported by the elongated piezo bender; and
    an electrical driving signal generator configured to generate a signal to create a vibration in the elongated piezo bender.

6. The haptic device according to claim 5, wherein the mass is positioned in between the first holder and the second holder.

7. The haptic device according to claim 5, wherein the mass is positioned at or near the first end of the elongated piezo holder.

8. The haptic device according to claim 5, further comprising a first actuator configured to move the first holder towards and away from the second holder to vary the distance between the first holder and the second holder.

9. The haptic device according to claim 8, further comprising a second actuator configured to move the second holder towards and away from the first holder to vary the distance between the first holder and the second holder.

10. The haptic device according to claim 5, wherein the first holder comprises a plurality of first holders located on one side of the mass, and the second holder comprises a plurality of second holders located on the other side of the mass as the first holder, and wherein different ones of the plurality of first holders are actuated and different ones of the plurality of second holders are actuated to vary the holding distance.

11. The haptic device according to claim 5, wherein the mass is located on one side of the elongated piezo bender.

12. The haptic device according to claim 11, wherein the mass has a non-uniform thickness.

13. The haptic device according to claim 12, wherein the mass has a non-uniform thickness in a direction along a major axis of the elongated piezo bender.

14. The haptic device according to claim 12, wherein the mass has a cross-sectional C-shape in a direction along a minor axis of the elongated piezo bender.

15. The haptic device according to claim 5, further comprising a pair of dampers, wherein each damper is located in between one end of the mass and the elongated piezo bender.

16. A haptic device, comprising:
an elongated piezo bender supported by a first holder and a second holder, the first holder and the second holder being spaced apart from each other and located at or near opposite ends of the elongated piezo bender;
a mass supported by the elongated piezo bender and positioned in between the first holder and the second holder, the mass having a non-uniform thickness in a direction along a minor axis of the elongated piezo bender so that portions of the mass at least partially surround the elongated piezo bender; and
an electrical driving signal generator configured to generate a signal to create a vibration in the elongated piezo bender.

17. The haptic device according to claim 16, wherein the mass has a cross-sectional C-shape in a direction along a minor axis of the elongated piezo bender.

18. The haptic device according to claim 16, further comprising a rigid connector in between a center of the mass and the elongated piezo bender.

19. The haptic device according to claim 16, further comprising a pair of dampers, wherein each damper is located in between one end of the mass and the elongated piezo bender.

* * * * *